April 3, 1956 J. E. ECKERT 2,740,889

STABLE ULTRA-HIGH FREQUENCY OSCILLATION GENERATOR

Filed July 31, 1951

INVENTOR
James E. Eckert
BY Charles H. Brown
ATTORNEY

United States Patent Office 2,740,889

Patented Apr. 3, 1956

2,740,889

STABLE ULTRA-HIGH FREQUENCY OSCILLATION GENERATOR

James Edmund Eckert, Princeton, N. J., assignor to Radio Corporation of America, a corporation of Delaware Application July 31, 1951, Serial No. 239,436

10 Claims. (Cl. 250—36)

The invention relates to oscillation generators, and it particularly pertains to U. H. F. oscillators useful for television and like applications in the 500 to 1,000 mc./s. spectrum.

With the advent of television broadcasting in the U. H. F. region a simple oscillator circuit which is tunable over the entire range between 500 and 1,000 mc./s. is particularly desirable. It is also particularly desirable that such an oscillator have only one tuning element. It has been suggested, therefore, that the desired results could be obtained with a variable U. H. F. vacuum tube connected in a modified Colpitts circuit with the interelectrode capacities providing the feedback path. The tubes previously available, however, lacked the necessary interelectrode capacity to meet the requirement, and the addition of external capacity elements has been found to limit the upper frequency practically to a value below 800 mc./s. Also the known circuit arrangements, when designed for this frequency band are subject to drift due to temperature variations to such extent that the circuits are not usable. Furthermore, such known circuits have not been sufficiently active to provide oscillations from 500 to 1,000 mc./s. without some energy absorption resulting in dead spots at one or more points in the tunable frequency band. Recently a new tube of the popularly termed "pencil triode" type has been developed. This tube has shown considerable promise for applications of the type mentioned.

It is an object of the invention to produce an improved oscillator circuit tunable by means of a single tuning element over substantially the entire 500–1,000 mc./s. band which is substantially unaffected by ambient temperature variations.

It is a further object of the invention to produce an improved stable oscillator circuit having relatively high output with no dead spots over substantially the entire 500–1,000 mc./s. frequency band.

The foregoing objects have been attained according to the invention in a circuit arrangement comprising a grid controlled vacuum tube connected in a modified Colpitts oscillator circuit including a section of transmission line with given ends of the component conductors connected to the electrodes of the vacuum tube and the other ends terminated by a variable tuning capacitor, and a frequency stabilizing capacitor connected across the component conductors at a voltage nodal point at some frequency above the highest frequency of the band of frequencies to be covered. The frequency stabilizing capacitor has a sufficient negative temperature coefficient substantially to compensate for any drift in frequency at the low frequency end of the band.

The invention will be described in greater detail with reference to the accompanying drawing, forming a part of the specification, and in which.

Figures 1, 2, 3:
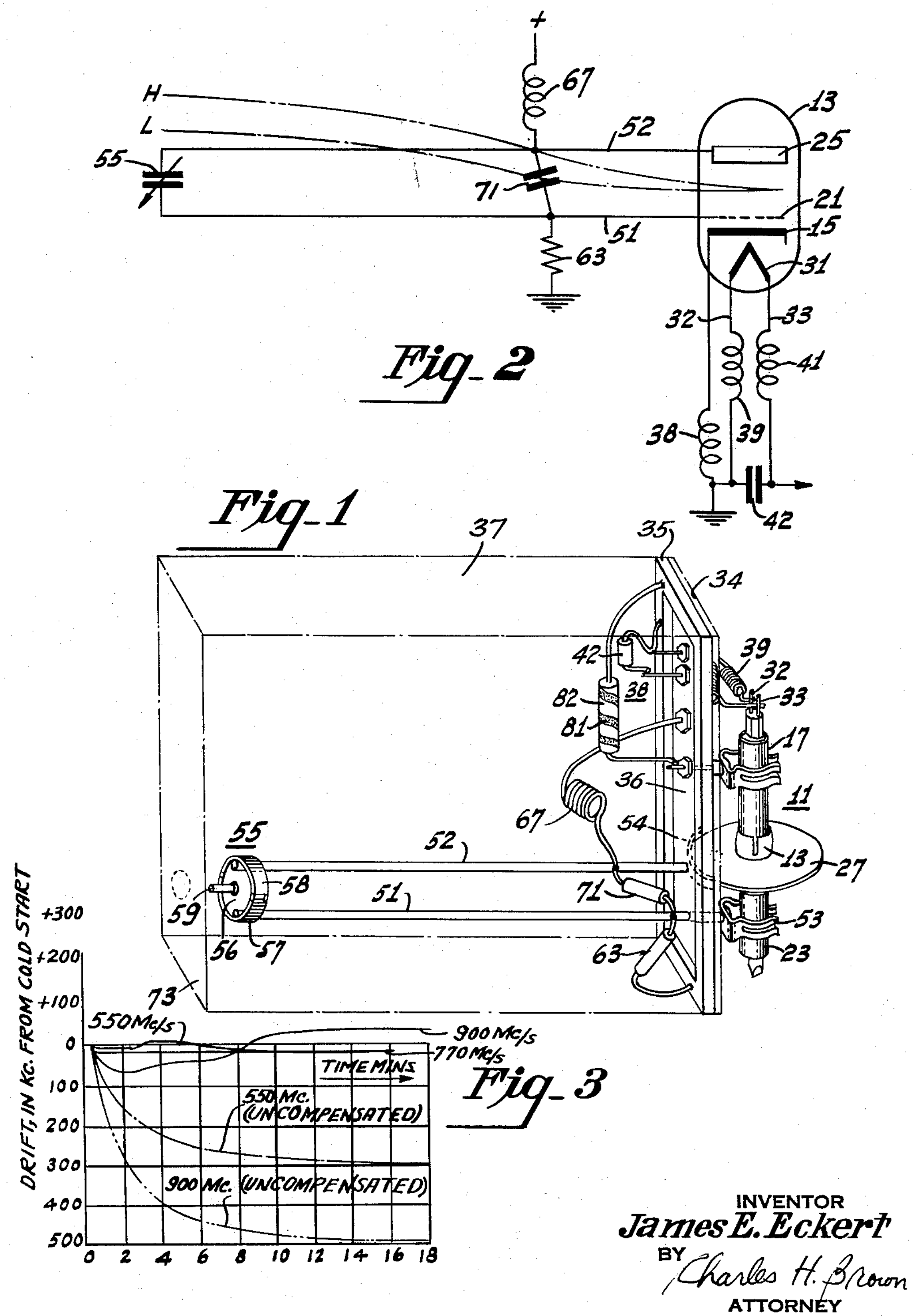
Fig. 1 is an illustration of the physical construction of an oscillator generator according to the invention.
Fig. 2 is a schematic diagram of the embodiment of the invention illustrated in Fig. 1.
Fig. 3 is a graphical representation of the operation of the arrangement illustrated in Fig. 1 and diagrammatically shown in Fig. 2.

Referring to Figs. 1 and 2, there is shown a triode 11 of the "pencil triode" type, having concentrically arranged electrodes. The tube as presently made is approximately 2" long and ½" in diameter or less, save for a central disc member. A cathode electrode 15 within the envelope 13 is connected to a hollow cylindrical metal terminal 17 approximately ⅝" long and ¼" in diameter. Similarly a control grid electrode 21 is connected to a cylindrical metal terminal 23 of the same form as terminal 17. An anode electrode 25 is connected to an external terminal in the form of a ¾" diameter flange 27 located at substantially the center of the tube structure. A heater element 31 is connected to external leads 32 and 33 which pass through the quarter inch diameter cathode terminal 17.

The "pencil triode" type tube lends itself to any number of mounting arrangements, the arrangement shown in Fig. 1 being particularly convenient for use in mass production television or FM receivers. A plate member 34 of insulating material shown only in phantom for clarity is mounted on a metal plate 35 having a large aperture 36. Plate 35 preferably forms the base of a shielding can 37 shown here only in phantom, but it may form a part of the chassis of the receiver if desired. Preferably the cathode electrode 15 is connected to ground or some other point of fixed reference potential by means of an inductor or R. F. choke 38 mounted directly on plate 35. One end of the heater element 31 is connected to ground or other point of fixed reference potential by means of another inductor or R. F. choke 39, the axis of which is preferably arranged normal to that of the first R. F. choke 38. The other end of the heater element is connected to a source of heater operating potential by means of a further inductor 41. Preferably a by-pass capacitor 42 is connected between plate 35 and the point of application of heater potential to inductor 41. The tuned circuit for the oscillator according to the invention comprises a pair of metallic rods or tubular conductors 51 and 52 which are preferably between ⅛ and ¼ wavelength long at the mid-band frequency. In the embodiment shown in Fig. 1 the conductors 51 and 52 are formed of 1½" lengths of silvered "Kovar" leads 0.05" in diameter and spaced ⅜" apart. The conductors 51 and 52 are connected at given ends to grid electrode 21 and anode electrode 25, respectively. A fuse clip 53, mounted on insulating member 34 and slotted to insure several contact points, is preferably used to connect conductor 51 to terminal 23, while a semi-circular spring member 54 mounted on member 34 makes contact between conductor 52 and flange 27. The other ends of conductors 51 and 52 are connected to a variable capacitor 55 comprising a relatively thick substantially annular ceramic member 56 having two conductive surfaces 57 and 58 preferably formed by silver plating which are electrically connected to conductors 51 and 52, respectively. Tuning is accomplished by means of a brass slug 59 which is arranged in a central aperture of dielectric member 56 to be moved in and out of the aperture. Any known mechanical arrangement such as employed in permeability tuners will be satisfactory for the purpose. A grid resistor 63 is connected between the line conductor 51 at a predetermined point thereon and the metal plate member 35. Direct operating potential is applied to the anode 25 by means of an R. F. choke 67 which is connected to the line conductor 52 at a predetermined point on that conductor, corresponding to the point mentioned on the other line conductor 51. A capacitor 71 is connected across conductors 51 and 52 at the predetermined points of connection of the grid resistor 63 and R. F. choke 67 previously mentioned.

These points of connection are determined by the amount of compensation required by the particular circuit to which the invention is to be applied as will be shown hereinafter. Since a capacitor is ineffective if there is no potential applied across it, the circuit when operating at a given frequency will not be affected at all by the frequency drift compensating capacitor 71 if it is placed at a voltage nodal point for the given frequency. As the frequency of oscillation is lowered, the voltage minimum or nodal point moves away from the point of connection of the compensating capacitor 71. The compensating capacitor 71 then becomes more and more effective as more and more standing wave potential is applied thereacross due to the lowering of the frequency. The characteristics of the compensating capacitor 71 depend on the total amount of compensation required at or near the lowest frequency at which operation is desired. The point of connection of the compensating capacitor 71 to the line conductors 51 and 52 is dependent on the compensation required at or near the highest frequency at which operation is desired. The point of connection may be considered as the voltage nodal point for some frequency higher than the highest frequency of the desired band, so that the compensating capacitor having, which has proper characteristics for substantially complete compensation at the lowest frequency of the desired band, will provide just sufficient compensation at the highest frequency of the desired band. This assumes a straight line characteristic between the degree of compensation obtained and the frequency at which it is desired. Some degree of flexibility is available to the designer since the compensation frequency characteristic is not exactly linear in most cases. A capacitor having characteristics substantially meeting the requirements for low frequency compensation, placed at a point removed from the voltage anode at the high frequency end of the band by an amount sufficient to provide the required high frequency compensation, will still provide the low frequency compensation required, within the desired tolerance. In one particular case, the nodal points were located about ¼″ from the tube 11 on the grid and anode lines 51 and 52. Due to stray reactance components the points on the two lines tend to differ in physical location. In this manner, the compensating capacitor 71 did not affect operation at the high frequency end of the band to its full capability because it was located very near to the nodal point of the standing wave of the highest frequency in the band. As the frequency was lowered the nodal point moved away from the tube and capacitor 71 became more effective. Since the R. F. voltage across capacitor 71 was greatest at 560 mc., the extent of compensation was adjusted at this frequency. For this one actual case, it was found that the combination for best compensation of 560 mc. was a 1.5 $\mu\mu$fd. capacitor having a −750 p. p. m. temperature coefficient.

In order to improve upon the strength of the oscillator output at the high frequency end of the band and to eliminate any absorption tending to cause dead spots in the tuning, a small inductance element 38 with a low Q was interposed in the cathode circuit. A piece of Nichrome ribbon 81, 2″ long, wound on a ⅛″ diameter glass rod 82 furnished a suitable inductance that resonated with the anode-to-cathode interelectrode capacitance of tube 11 at 520 mc./s. Nichrome ribbon is use to provide sufficient resistance to lower the Q of the circuit as a low resistance choke was found to ground the grid at some frequency within the band because of series resonance of the cathode choke and the grid-to-cathode interelectrode capacitance. For some unexplainable reason a copper wire choke and series resistor would not function in the desired manner. Filament chokes 39 and 41 were designed to provide optimum oscillating conditions at 920 mc./s.

Referring to Fig. 3, there are three curves at the upper part of this figure showing the frequency drift in kilocycles per second over a period of time for three frequencies for an actually constructed circuit arrangement according to the invention. Additional curves (labeled "uncompensated") represent the frequency drift of the same circuit arrangement without the compensating features of the invention for two frequencies near the extreme limits of the band.

The invention claimed is:

1. In an oscillation generator including a resonant circuit comprising a pair of elongated, parallel conductors connected at given ends to elements of a controlled electron path device, and also including a variable impedance element connected across the other ends of the conductors to tune across a wide band of frequencies; said resonant circuit being subject to frequency drift due to temperature variations: a frequency stabilizing component comprising a capacitor having a negative temperature coefficient and having a value of capacitance minimizing said frequency drift near the low frequency end of said band, said capacitor being connected across said parallel conductors at a point removed from the voltage nodal point at the highest frequency of said wide band of frequencies, so that said capacitor is effective to also minimize said frequency drift near the high frequency end of said band.

2. In an oscillation generator including a resonant circuit comprising a pair of elongated, parallel conductors connected at given ends to elements of a controlled electron path device, and also including a variable impedance element connected across the other ends of the conductors to tune across a wide band of frequencies, said resonant circuit being subject to frequency drift due to temperature variations: a frequency stabilizing component comprising a fixed impedance element having a temperature coefficient of impedance and having a value of impedance minimizing said frequency drift near the low frequency end of said band, said fixed impedance element being connected across said parallel conductors at a point removed from the voltage nodal point at the highest frequency of said wide band of frequencies, so that said fixed impedance element is effective to also minimize said frequency drift near the high frequency end of said band.

3. In an oscillation generator including a tuned circuit structure comprising a pair of elongated conductors forming a section of transmission line, given ends of said conductors being connected to electrodes of at least one controlled electron path device, and also including a variable capacitor connected across the remaining ends of said conductors to tune said generator over a wide band of frequencies, said tuned circuit structure being subject to frequency drift due to ambient temperature variations: a fixed capacitor having a negative temperature coefficient, said fixed capacitor being connected across said conductors at a point removed from the voltage nodal point of a standing wave at the high frequency end of said band, said fixed capacitor having a value minimizing said frequency drift over said band of frequencies.

4. A stable ultra-high frequency oscillation generator comprising at least one controlled electron path structure having a cathode, anode and control electrodes, a low Q circuit connecting said cathode electrode to a point of fixed reference potential, a pair of elongated conductors forming a section of transmission line having given ends individually connected to said control and anode electrodes, a variable impedance element coupled to the other ends of said conductors to tune said generator over a wide frequency band, a resistance element connected between a point intermediate the ends of the one of said conductors connected to said control electrode and said point of fixed reference potential, means to connect a source of anode potential at a point intermediate the ends of the other of said conductors, said points being substantially at the voltage nodal point of a standing wave above the high frequency end of said band, and a temperature drift minimizing network coupled to said conductors at said points.

5. A stable ultra-high frequency oscillation generator comprising at least one controlled electron path structure having cathode, anode and control electrodes, a circuit comprising an inductor having a nichrome winding connecting said cathode electrode to a point of fixed reference potential, a pair of elongated conductors forming a section of transmission line having given ends individually connected to said control and anode electrodes, a variable capacitor coupled to the other ends of said conductors to tune said generator over a wide frequency band, a resistor connected between a point intermediate the ends of the one of said conductors connected to said control electrode and said point of fixed reference potential, means to connect a source of anode potential at a point intermediate the ends of the other of said conductors, said points being substantially at the voltage nodal point of a standing wave above the high frequency end of said band, and a temperature drift minimizing capacitor coupled to said conductors at said points.

6. A stable ultra-high frequency oscillation generator normally subject to frequency drift due to temperature variations, comprising at least one electron discharge structure having a cathode electrode, a control grid and an anode electrode; an inductor having a high resistance component connecting said cathode electrode to a point of fixed reference potential, a pair of elongated conductors forming a section of transmission line having given ends individually connected to said control grid and said anode electrode, a variable capacitor coupled to the other ends of said conductors to tune said generator over a wide frequency band, a resistor connected between a point intermediate the ends of the one of said conductors connected to said control grid and said point of fixed reference potential, a radio frequency choke connected at a point intermediate the ends of the other of said conductors, said points being substantially at the voltage nodal point of a standing wave above the high frequency end of said band, and a drift minimizing capacitor coupled across said conductors at said points, said minimizing capacitor having a value of capacitance and a temperature-capacitance characteristic substantially minimizing said frequency drift over said wide frequency band.

7. An oscillation generator comprising an electron discharge device having heater, cathode, grid and anode elements, a resonant circuit comprising ai pair of elongated, parallel conductors connected at given ends to said grid and anode elements; a variable impedance element connected across the other ends of the conductors to tune across a band of frequencies substantially from 500 to 1000 megacycles per second, said resonant circuit being subject to frequency drift due to temperature-impedance variations, a frequency stabilizing component comprising a fixed impedance element having a negative temperature characteristic, said impedance element being connected across said parallel conductors at a point substantially at a voltage nodal point at a frequency above the high frequency end of said wide band of frequencies and having a value minimizing said frequency drift over said band; an inductance element connected in circuit with the cathode element and having a value resonating with the anode-cathode inter-electrode capacitance near the low frequency end of said band of frequencies, and a choke element in circuit with each heater element, said choke elements having values providing optimum oscillating conditions at a frequency near the high end of said band of frequencies.

8. In an oscillation generator circuit including as a frequency determining device a transmission line having adjustable means for effectively varying the length of the line to tune the generator over a frequency range, the generated oscillations being subject to undesired variations occasioned by temperature changes: a frequency stabilizing component connected to said line and comprising an impedance device providing a variable impedance as a function of temperature and having a magnitude and temperature coefficient which operate to minimize the effects of temperature changes on the frequency of the generated oscillations at the low frequency end of said range, said impedance device being connected to said transmission line at a point intermediate the ends thereof and near a voltage nodal point for a frequency appreciably higher than the lowest frequency of said range for simultaneously minimizing the effects of temperature changes at the high frequency end of the range.

9. In an oscillation generator circuit including as a fraequency determining device a transmission line having adjustable means for effectively varying the length of the line to tune the generator over a frequency range, the generated oscillations being subject to undesired variations occasioned by temperature changes: a frequency stabilizing component connected to said line and comprising an impedance device providing a variable impedance as a function of temperature and having a magnitude and temperature coefficient which operate to minimize the effects of temperature changes on the frequency of the generated oscillations at the low frequency end of said range, said impedance device being connected to said transmission line at a voltage nodal point of a standing wave the frequency of which is higher than the highest frequency of said range.

10. In a variable frequency generator circuit tunable over a frequency range by means of a transmission line provided with an adjustable means associated therewith for effectively varying its electrical length, the frequency generated by said generator being subject to undesired variations due to temperature change, the method of minimizing the effect of temperature change on the generated frequency throughout said range which includes placing across the line at a voltage nodal point of a standing wave the frequency of which is higher than the highest frequency of said range a lumped circuit element of such magnitude and having an impedance which varies as a function of temperature in such degree as to minimize the effect of temperature change at the low frequency end of said range whereby minimizing of the temperature change effect is simultaneously provided at the high frequency end of said range.

References Cited in the file of this patent

UNITED STATES PATENTS

| | | |
|---|---|---|
| 2,429,656 | Willoughby | Oct. 28, 1947 |
| 2,440,308 | Storck | Apr. 27, 1948 |
| 2,539,218 | Worcester | Jan. 23, 1951 |
| 2,549,923 | O'Brien | Apr. 24, 1951 |
| 2,568,435 | Downey | Sept. 18, 1951 |
| 2,618,748 | Rust | Nov. 18, 1952 |

FOREIGN PATENTS

| | | |
|---|---|---|
| 389,346 | Great Britain | Mar. 16, 1933 |